(12) United States Patent
Dilhan et al.

(10) Patent No.: US 11,764,242 B2
(45) Date of Patent: Sep. 19, 2023

(54) IMAGE SENSOR WITH PIXEL MATRIX AND MICROLENS MATRIX HAVING DIFFERING PITCHES FROM EACH OTHER

(71) Applicants: STMicroelectronics (Crolles 2) SAS, Crolles (FR); Commissariat A L'Energie Atomique Et Aux Energies Alternatives, Paris (FR)

(72) Inventors: Lucie Dilhan, Grenoble (FR); Jerome Vaillant, Paris (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 172 days.

(21) Appl. No.: 17/070,537

(22) Filed: Oct. 14, 2020

(65) Prior Publication Data

US 2021/0111211 A1 Apr. 15, 2021

(30) Foreign Application Priority Data

Oct. 14, 2019 (FR) ...................................... 1911402

(51) Int. Cl.
*H01L 27/146* (2006.01)

(52) U.S. Cl.
CPC .. *H01L 27/14627* (2013.01); *H01L 27/14603* (2013.01); *H01L 27/14605* (2013.01); *H01L 27/14643* (2013.01); *H01L 27/14685* (2013.01)

(58) Field of Classification Search
None
See application file for complete search history.

(56) References Cited

U.S. PATENT DOCUMENTS

| 2009/0179142 A1* | 7/2009 | Duparre | H01L 27/14627 438/69 |
| 2012/0262635 A1 | 10/2012 | Hirigoyen et al. | |
| 2015/0192705 A1* | 7/2015 | Nimura | G03B 21/006 216/26 |
| 2020/0084850 A1* | 3/2020 | Eble | H01L 31/143 |

(Continued)

FOREIGN PATENT DOCUMENTS

| EP | 2 717 561 A1 | 4/2014 |
| WO | 2006/132501 A1 | 12/2006 |

OTHER PUBLICATIONS

Arbabi et al., "Subwavelength-thick lenses with high numerical apertures and large efficiency based on high-contrast transmitar-rays," *Nature Communications*, vol. 6, published May 7, 2015, 6 pages.

(Continued)

*Primary Examiner* — Jennifer D Bennett
*Assistant Examiner* — Erin R Garber
(74) *Attorney, Agent, or Firm* — Seed IP Law Group LLP

(57) ABSTRACT

The present disclosure relates to an image sensor including a plurality of pixels formed in and on a semiconductor substrate and arranged in a matrix with N rows and M columns, with N being an integer greater than or equal to 1 and M an integer greater than or equal to 2. A plurality of microlenses face the substrate, and each of the microlenses is associated with a respective pixel. The microlenses are arranged in a matrix in N rows and M columns, and the pitch of the microlens matrix is greater than the pitch of the pixel matrix in a direction of the rows of the pixel matrix.

19 Claims, 6 Drawing Sheets

(56) References Cited

U.S. PATENT DOCUMENTS

2021/0271003 A1* 9/2021 Yang .................. G06V 40/12
2021/0368117 A1* 11/2021 Nishi .................. H01L 27/146

OTHER PUBLICATIONS

Audran et al., "Grayscale lithography process study applied to zero-gap microlenses for sub 2μm CMOS image sensors," *Proceedings of SPIE*, vol. 7639, 2010, 12 pages.

Fan et al., "Advanced microlens and color filter process technology for the high-efficiency CMOS and CCD image sensors," *Proceedings of SPIE*, vol. 4115, 2000, 13 pages.

Gonidec, "Concept of non-periodic metasurfaces based on positional gradients applied to IR-flat lenses," *Optical Materials Express* 2346, vol. 7(1), Jul. 2017, 6 pages.

Huang et al., "A Microlens Reactive Ion Etching Process Study on CMOS Image Sensor—Wen-Hao Lo," e-Manufacturing & Design Collaboration Symposium 2018, 3 pages.

Onozawa et al., "A MOS Image Sensor With a Digital-Microlens," *IEEE Transactions on Electron Devices* 55(4):986-991, Apr. 2008.

Peng et al., "High fidelity fabrication of microlens arrays by nanoimprint using conformal mold duplication and low-pressure liquid material curing," *Journal of Vacuum Science & Technology B: Microelectronics and Nanometer Structures Processing, Measurement, and Phenomena* 25(2):410-414, Mar./Apr. 2007.

Ximenes et al., "A 256x256 45/65nm 3D-Stacked SPAD-Based Direct TOF Image Sensor for LiDAR Applications with Optical Polar Modulation for up to 18.6dB Interference Suppression," 2018 IEEE International Solid-State Circuits Conference, Session 5, Image Sensors, 5.9, 3 pages.

Hsu et al., "Microlens design for compact lens system," *Proceedings of SPIE* 5116:640-646, Apr. 24, 2003. (8 pages).

Hudelist et al., "Design and fabrication of nano-structured gradient index microlenses," *Optics Express* 17(5):3255-3263, Mar. 2, 2009.

Kurt, "Graded index photonic crystals," *Optics Express* 15(3):1240-1253, Feb. 5, 2007.

Nowosielski et al., "Focusing a Gaussian beam in nanostructured non-periodic GRIN microlenses," *Photonics Letters of Poland* 2(1):34-36, 2010. (4 pages).

Turduev, "Photonic Crystals Engineering for Light Manipulation: Low Symmetry, Graded Index and Parity Time Symmetry," dissertation, TOBB University of Economics and Technology, 2015, pp. ii-145, (156 pages).

Vaillant et al., "SPAD array sensitivity improvement by diffractive microlens," 2019 International Image Sensor Workshop (IISW), Snowbird, UT, USA, Jun. 23-27, 2019 (4 pages).

\* cited by examiner

IMAGE SENSOR WITH PIXEL MATRIX AND MICROLENS MATRIX HAVING DIFFERING PITCHES FROM EACH OTHER

BACKGROUND

Technical Field

The present disclosure relates generally to the field of image sensors. It is more specifically directed to an image sensor including a pixel matrix formed in and on a semiconductor substrate and topped by a microlens matrix.

Description of the Related Art

An image sensor conventionally comprises a plurality of pixels formed in and on a semiconductor substrate and arranged in a matrix in rows and columns. Each pixel typically comprises a photosensitive area in which the incident light is converted into electron-hole pairs, and one or several control transistors making it possible to read a signal representative of a quantity of photo-generated charges in the photosensitive area. Thus, the photosensitive area of the pixel only occupies part of the surface of the pixel. In order to compensate for the loss of collection surface related to the fill factor of the pixel, and to increase the sensitivity of the pixels, it has already been proposed to arrange, on each pixel, a microlens extending over substantially the entire surface of the pixel and configured to concentrate the incident light on the photosensitive area of the pixel.

It would be desirable to at least partially improve certain aspects of the known image sensors including a pixel matrix formed in and on a semiconductor substrate and topped by a microlens matrix.

BRIEF SUMMARY

To that end, one embodiment provides an image sensor including a plurality of pixels formed in and on a semiconductor substrate and arranged in a matrix with N rows and M columns, with N being an integer greater than or equal to 1 and M an integer greater than or equal to 2, and, for each pixel, a microlens associated with the pixel, arranged facing the substrate, the microlenses being arranged in a matrix in N rows and M columns, wherein, in the direction of the rows of the pixel matrix, the pitch of the microlens matrix is greater than the pitch of the pixel matrix.

According to one embodiment, the optical axis of each microlens passes through the center of a photosensitive area of the pixel with which it is associated.

According to one embodiment, the microlens matrix comprises off-axis microlenses.

According to one embodiment, N is greater than or equal to 2, and, in the direction of the columns of the pixel matrix, the pitch of the microlens matrix is greater than the pitch of the pixel matrix.

According to one embodiment, the pixels of the plurality of pixels have the same size in the direction of the rows of the pixel matrix and in the direction of the columns of the pixel matrix.

According to one embodiment, the microlenses of the plurality of microlenses all have the same dimensions in the direction of the rows of the pixel matrix and in the direction of the columns of the pixel matrix.

According to one embodiment, microlenses of the plurality of microlenses have different dimensions in the direction of the rows of the pixel matrix and/or in the direction of the columns of the pixel matrix.

According to one embodiment, the surface of each microlens is larger when the distance between the central axis of the microlens and the central axis of the pixel with which it is associated is large.

According to one embodiment, the sensor includes an optical space arranged between the pixel matrix and the microlens matrix.

According to one embodiment, the microlenses are refractive microlenses, or diffractive microlenses.

According to one embodiment, the microlenses are diffractive microlenses of the FZP type.

According to one embodiment, the microlenses are diffractive microlenses of the meta-surface type.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the embodiment of the pixel matrices and peripheral control circuits of the disclosed image sensors has not been described in detail, the disclosed embodiments being compatible with the usual embodiments of these elements.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures, with the understanding that, in practice, the described devices can be oriented differently.

Unless specified otherwise, the expressions "around", "approximately", "substantially" and "in the order of" signify within 10%, and in some embodiments within 5%.

Figure 1A:
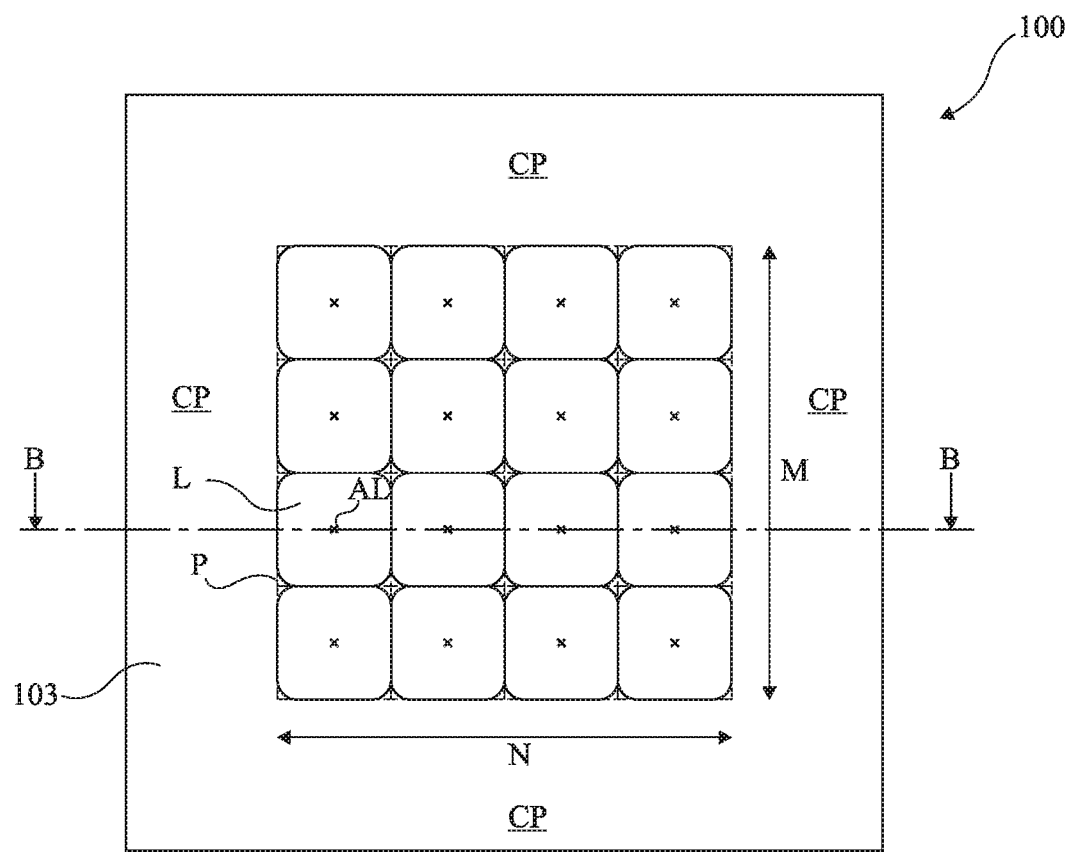
FIG. 1A schematically shows a top view of an example of an image sensor.
Figure 1B:
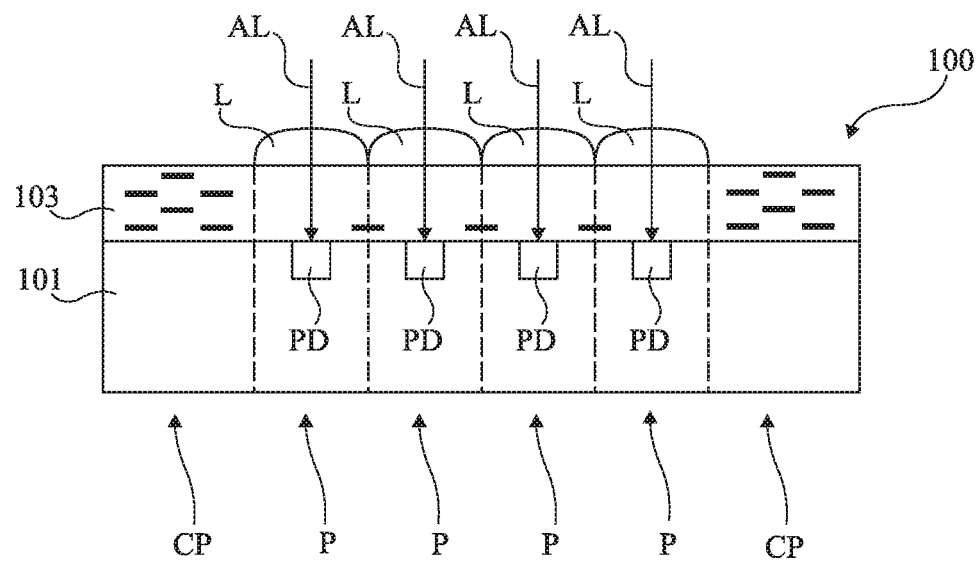
FIG. 1B schematically shows a cross-sectional view of the image sensor shown in FIG. 1A.

FIG. 1 schematically shows an example of an image sensor 100. FIG. 1 more specifically comprises a top view (FIG. 1A) of the sensor 100 and a cross-sectional view (FIG. 1B) along plane B-B.

The sensor 100 comprises a plurality of pixels P formed in and on a semiconductor substrate 101, for example made from silicon. The pixels P for example all have the same dimensions, to within any machining dispersions. The pixels P for example, in top view, have a square or rectangular shape. In the figures, the pixels P are delimited laterally by dotted lines. The pixels P are arranged regularly in a matrix of M columns by N rows, with M and N being integers greater than or equal to 2. In the illustrated example, a matrix of M=4 by N=4 pixels has been shown. In practice, the matrix may comprise a greater number of rows and columns.

Each pixel includes a photosensitive area PD formed in the substrate 101. Each pixel may further include control elements, for example one or several control transistors (not described in detail in the figure), formed in and on the substrate 101, for example in a peripheral region of the pixel, around the photosensitive area PD of the pixel (in top view).

The sensor 100 further comprises a peripheral circuit CP (not described in detail in the figure) formed in and on the substrate 101, arranged in a peripheral region of the sensor, around the pixel matrix P (in top view). The peripheral circuit CP can for example comprise power supply, control and/or read circuits of the pixel matrix P and/or metallizations for connecting the sensor to an outside device.

FIG. 1 further shows, on the side of the upper face of the substrate 101, a stack of insulating and conductive layers (not described in detail in the figure), also called interconnect stack, on which tracks, vias and metal contacts can be formed for interconnecting pixels P and the peripheral circuit CP of the sensor. In the illustrated example, the interconnect stack 103 is arranged on the side of the illumination face of the substrate 101, that is to say, on the side of the upper face of the substrate 101 in the orientation of the cross-sectional view of FIG. 1B. This is then called front-side-illumination (FSI) sensor. As a variant, the interconnect stack 103 can be arranged on the side opposite the illumination face of the substrate 101, that is to say, on the side of the lower face of the substrate 101 in the orientation of the cross-sectional view of FIG. 1B. This is then called back-side-illumination (BSI) sensor. Although the examples shown in the figures and disclosed in the present disclosure all relate to sensors of the FSI type, the disclosed embodiments can of course be configured for sensors of the BSI type.

The sensor 100 further comprises, for each pixel P, a microlens L arranged on the illumination face of the pixel, that is to say, on its upper face and the orientation of the cross-sectional view of FIG. 1B. In the illustrated example, each microlens L has, seen from above, a surface substantially equal to the surface of the underlying pixel P and is arranged substantially over the underlying pixel P. Thus, the set of microlenses L defines a matrix of M×N microlenses, the pitch of the microlens matrix L (that is to say, the center distance between two adjacent microlenses of the microlens matrix) and the pitch of the pixel matrix P (that is to say, the center distance between two adjacent pixels of the pixel matrix) being substantially identical in the direction of the rows, and the pitch of the microlens matrix L and the pitch of the pixel matrix P being substantially identical in the direction of the columns.

Each microlens L is configured to concentrate the light received on its upper face toward the photosensitive area PD of the underlying pixel. In this example, each microlens L has an optical axis AL substantially orthogonal to the upper face of the substrate 101 (vertical in the orientation of the cross-sectional view of FIG. 1B), passing, seen from above, through the center of the photosensitive area PD of the pixel (coinciding in this example with the center of the pixel).

In the example of FIG. 1, it is considered that the light arrives with normal incidence on the upper face of the sensor 100. In the case of a sensor with large dimensions configured to be placed behind a compact objective, for example in the case of an image sensor embedded in a smartphone, the light generally arrives with normal incidence on the pixels located near the center of the pixel matrix, but can arrive with a relatively strong incline on the pixels located near the edges of the pixel matrix. In this case it is possible to provide for using microlenses L with dimensions slightly smaller than those of the pixels P, and shifting the microlenses toward the center of the sensor with a shift increasing as one moves away from the sensor center, so as to compensate for the incline of the incident light, for example as described in the article "Microlens design for compact lens system" by H.-J. Hsu, F.-T. Weng, C.-K. Chang, and Y.-K. Hsiao (Proc. SPIE 5116, Smart Sensors, Actuators, and MEMS, (Apr. 24, 2003)). In this case, the pitch of the microlens matrix L can be smaller than the pitch of the pixel matrix P in the direction of the rows and in the direction of the columns.

As an example, the microlenses L can be formed by resin contact creep, optionally followed by a shape transfer, for example as disclosed in the article "Advanced microlens and color filter process technology for the high-efficiency CMOS and CCD image sensors" by Y.-T. Fan, C.-S. Peng, and C.-Y. Chu (SPIE, 2000, vol. 4115, P. 263-274) and in the article "A Microlens Reactive Ion Etching Process Study on CMOS Image Sensor-Wen-Hao Lo" by P.-C. Huang, C.-H. Ting, K.-F. Huang, and T.-S. Tzeng (2018 e-Manufacturing & Design Collaboration Symposium (eMDC), p. 1-3). As a variant, the microlenses L can be formed by nanoprinting, for example as disclosed in the article "High fidelity fabrication of microlens arrays by nanoimprint using conformal mold duplication and low-pressure liquid material curing" by C. Peng, X. Liang, Z. Fu, and S. Y. Chou (J. Vac. Sci. Technol. B Microelectron. Nanometer Struct., vol. 25, no 2, p. 410, 2007), or by grayscale lithography, for example as disclosed in the article "Grayscale lithography process study applied to zero-gap microlenses for sub-2 μm CMOS image sensors" by S. Audran et al. (Proceedings of SPIE, 2010, p. 763910-763910).

The methods disclosed above lead to the formation of refractive microlenses of the planar-convex type, that is to say, including a substantially planar lower face or base, in contact with the upper face of the pixel, and a convex upper face. As a variant, the microlenses L can be made up of diffractive structures, working in a restricted wavelength range, for example as disclosed in the article "A MOS Image Sensor With a Digital-Microlens" by K. Onozawa et al. (IEEE Trans. Electron Devices, vol. 55, no 4, p. 986 991, April 2008) or in the article "A 256×256 45/65 nm 3D-stacked SPAD-based direct TOF image sensor for LiDAR applications with optical polar modulation for up to 18.6 dB interference suppression" by A. R. Ximenes, P. Padmanabhan, M. J. Lee, Y. Yamashita, D. N. Yaung, and E. Charbon (2018 IEEE International Solid—State Circuits Conference—(ISSCC), 2018, p. 96 98). As a variant, the microlenses L are meta-surface lenses, for example as disclosed in the article "Subwavelength-thick lenses with high numerical apertures and large efficiency based on high-contrast transmitarrays" by A Arbabi et al (Nature Communications, vol. 6, p. 7069, May 2015), or in the article "Concept of non-periodic metasurfaces based on positional gradients applied to IR-flat lenses" by M. Gonidec (Opt. Mater. Express 7, 2346-2351 (2017)).

One limitation of the sensor of FIG. 1 is that the surface occupied by the peripheral circuit CP is not used to collect light.

According to one aspect of one embodiment, it is provided to make an image sensor including a pixel matrix formed in and on a semiconductor substrate, and a microlens matrix topping the pixel matrix, in which the dimensions of the microlenses are larger than the dimensions of the pixels, which makes it possible to obtain a larger light collection surface for each pixel, by using all or part of the surface occupied by the circuit CP on the periphery of the pixel matrix as light collection surface. The pitch of the microlens matrix is then greater than the pitch of the pixel matrix. The sensor thus has an increased sensitivity relative to a sensor in which the dimensions of the microlenses are less than or equal to the dimensions of the pixels.

Figure 2A:
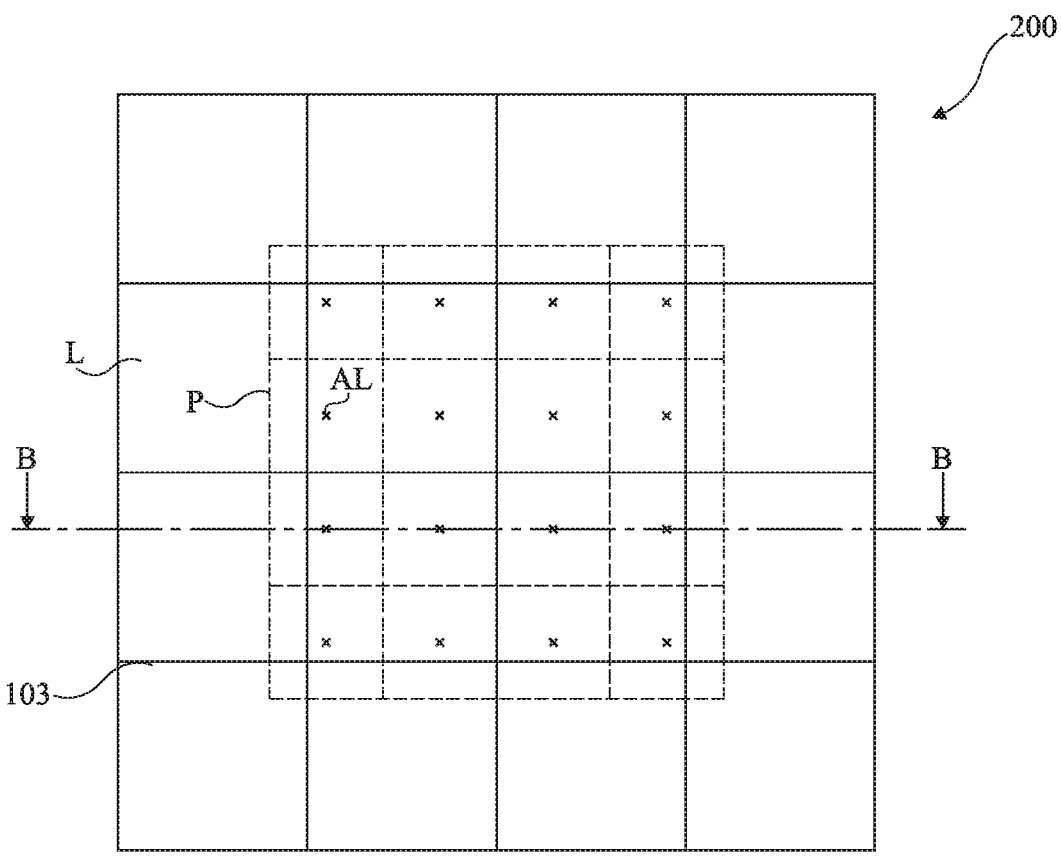
FIG. 2A schematically shows a top view of an example of an image sensor according to one embodiment.
Figure 2B:
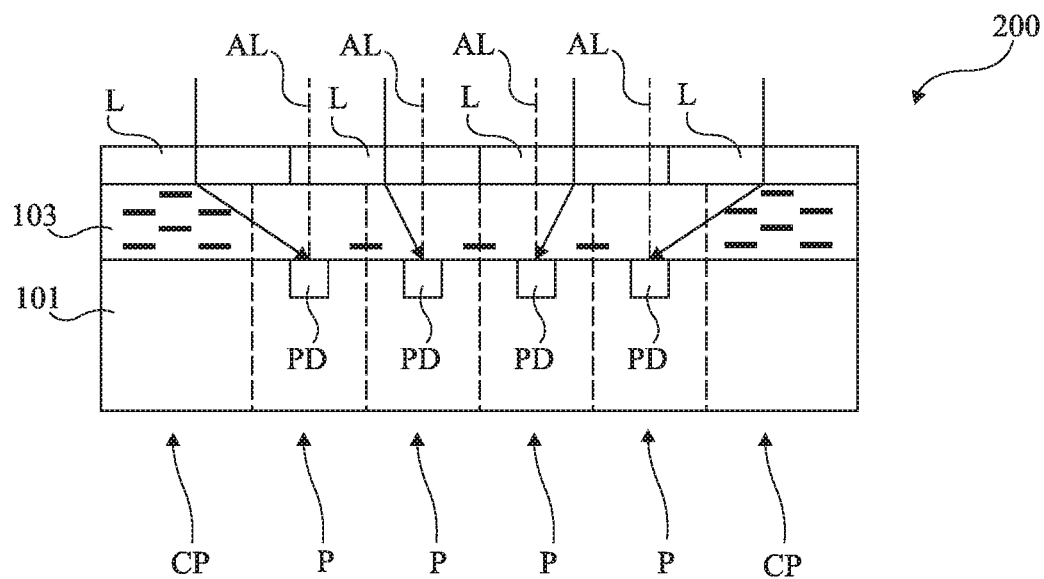
FIG. 2B schematically shows a cross-sectional view of the image sensor shown in FIG. 2A.

FIG. 2 schematically shows an example of an image sensor 200 according to one embodiment. FIG. 2 more specifically comprises a top view (FIG. 2A) of the sensor 200 and a cross-sectional view (FIG. 2B) along plane B-B.

The sensor 200 of FIG. 2 differs from the sensor 100 of FIG. 1 primarily by the dimensions of its microlens matrix.

Like in the example of FIG. 1, the sensor 200 comprises one microlens L per pixel P, or M×N microlenses L, arranged on the side of the illumination face of the sensor, that is to say, on the side of its upper face in the orientation of the cross-sectional view of FIG. 2B.

In the example of FIG. 2, each microlens L has, in top view, a surface greater than the surface of the pixel P with which it is associated. More specifically, each microlens has, in the direction of the rows and in the direction of the columns, dimensions larger than the dimensions of the pixel P with which it is associated. Like in the example of FIG. 1, the microlenses L are coplanar, that is to say, their bases, which are substantially planar, are arranged in a same plane corresponding, in the illustrated example, to the upper face of the interconnect stack 103. Thus, in top view, the dimensions of the microlens matrix L in the direction of the rows and in the direction of the columns are greater than the corresponding dimensions of the pixel matrix P, and the pitch of the microlens matrix L is greater than the pitch of the pixel matrix P, in the direction of the rows and in the direction of the columns. The microlens matrix L therefore extends not only over the entire surface of the pixel matrix P, but also over all or part of the peripheral surface of the sensor, occupied by the peripheral circuit CP. This makes it possible to increase the collection surface of each pixel P, and therefore to increase the sensitivity of the sensor relative to the example of FIG. 1. It will be noted that if the circuit CP comprises, on the side of the upper face of the sensor, metallizations for connecting the sensor to an outside device, these metallizations should be left accessible and therefore should not be covered by microlenses. The connection metallizations of the sensor will therefore delimit the available surface to extend the microlens matrix.

In the example of FIG. 2, in top view, the M×N microlenses L all have substantially the same shape, for example a square or rectangular shape, and the same dimensions (to within any machining dispersions), and are evenly distributed in rows and columns. In other words, the pitch of the microlens matrix L is constant in the direction of the rows and in the direction of the columns.

Each microlens L of the matrix of M×N microlenses is configured to concentrate the light received on its upper face with the photosensitive area PD of the pixel P with which it is associated, that is to say, the pixel P with the same coordinates in the sub-matrix of M×N pixels. In this example, each microlens L has an optical axis AL substantially orthogonal to the upper face of the substrate 101 (vertical in the orientation of the cross-sectional view of FIG. 2B), passing, seen from above, through the center of the photosensitive area PD of the pixel (coinciding in this example with the center of the pixel).

In the example of FIG. 2, the microlenses L are so-called off-axis microlenses, that is to say, microlenses whose optical axis is not located, in top view, at the center of the lens, which makes it possible to ensure the focusing of the light received by each microlens in the photosensitive area PD of the corresponding pixel, despite the difference in pitch between the pixel matrix and the microlens matrix.

The microlenses L are for example refractive microlenses formed by nanoprinting or by grayscale lithography, or diffractive lenses, also called meta-surfaces, formed by a diffractive array of nano-elements, for example formed by structuring a planar layer.

Figure 3:
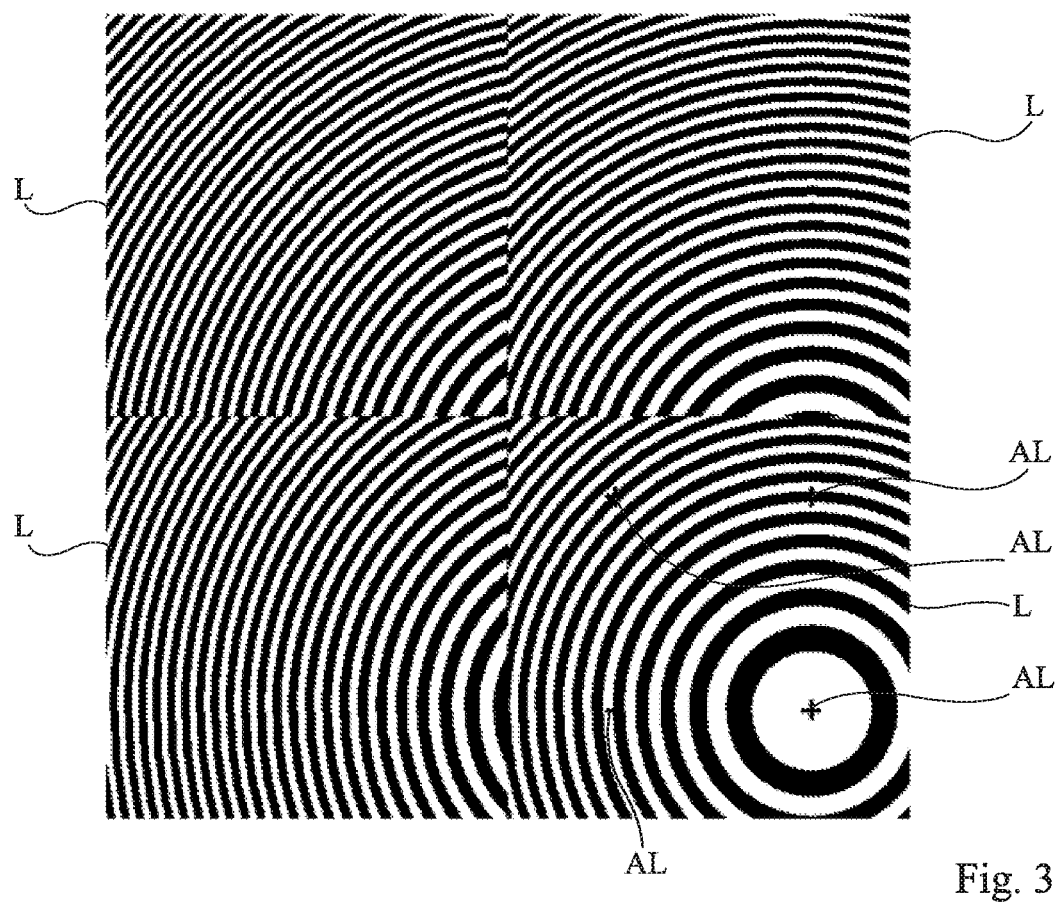
FIG. 3 schematically shows an example microlens of the image sensor of FIG. 2.

FIG. 3 schematically shows an example microlens of the image sensor of FIG. 2.

In this example, the microlenses are diffractive microlenses of the Fresnel Zone Plate (FZP) type, each made up of an array of concentric rings or ring portions formed by lithography and etching of a planar layer. In FIG. 3, for simplification purposes and due to the symmetry of the microlens matrix relative to its horizontal and vertical central axes, only four microlenses L, respectively corresponding to the four microlenses making up the upper left quadrant of the microlens matrix of the top view in FIG. 2A, have been shown.

The optical axis of each microlens L coincides with the center of the concentric rings or ring portions forming the microlens. As indicated above, the microlenses L are off-axis microlenses, which is obtained, in the example of FIG. 3, by the fact that the center of the concentric rings or ring portions forming each microlens is shifted relative to the center of the microlens. For certain microlenses L of the sensor, the optical axis of the microlens may not pass through the microlens. In the example of FIG. 3, the microlens is then made up solely of concentric ring portions who center is located outside the microlens.

Figure 4:
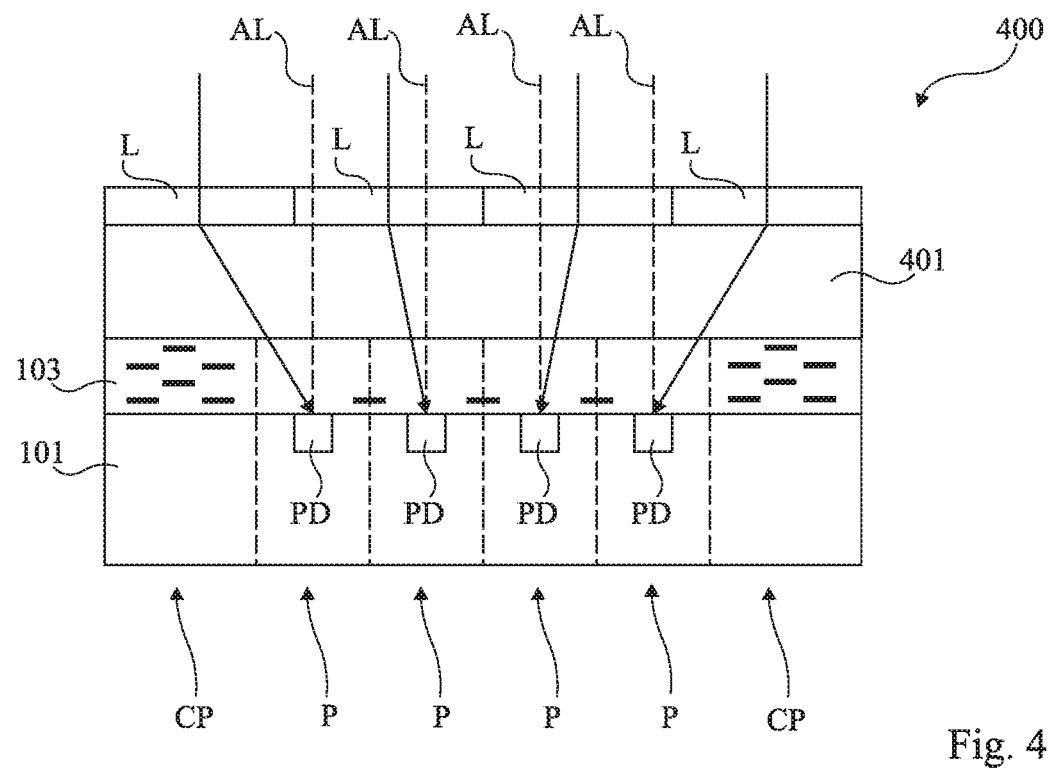
FIG. 4 illustrates a variant of the image sensor of FIG. 2.

FIG. 4 is a cross-sectional view in the same plane as the cross-sectional view of FIG. 2B, illustrating a variant of the image sensor of FIG. 2.

The sensor 400 of FIG. 4 differs from the sensor 200 of FIG. 2 in that it further comprises, between the upper face of the interconnect stack 103 and the lower face of the microlens matrix L, an optical spacer 401, in the form of a transparent planar layer, for example from 5 to 50 µm thick, for example in the order of 10 μm thick. The spacer 401 makes it possible to limit or eliminate any stray interactions of the incident light with the peripheral circuit CP of the sensor and/or with the interconnect metallizations of the pixels P of the sensor.

It will be noted that the embodiments disclosed above in relation with FIGS. 2 to 4 are particularly advantageous for low-resolution sensors, for example for M and N less than or equal to 100. Indeed, to keep a good light collection efficiency, it is preferable for the shift between the optical axis of the microlenses and the central axis of the pixels to remain limited. Here, X=x*PP denotes the maximum shift tolerated between the optical axis of a microlens L of the sensor and the central axis of the corresponding pixel P, with, preferably, x less than or equal to 2, and PP designating the pitch of the pixel matrix. With PL designating the pitch of the microlens matrix: PL=(M+2*x)/(M−1)*PP. The contributed gain G in sensitivity is then: $G=((M+2*x)/(M-1))^2$ (in the case M=N and considering that the pixels on the one hand, and the microlenses on the other hand, have identical dimensions in the direction of the rows and in the direction of the columns). For x=2 and M=N=100, one obtains G=1.1036, or gain of about 10%.

The embodiments disclosed above are in particular very advantageous in a sensor including a small SPAD (Single Photon Avalanche Diode) matrix sharing a same peripheral circuit CP, for example a M×N SPAD matrix with M and N less than or equal to 10, for example M=N=4.

A small SPAD matrix can in particular be used to form a sensor of the SiPM (Silicon PhotoMultiplier) type. In this case, the MxN SPADs are connected in parallel, which in particular makes it possible to increase the dynamic, or to add a time correlation filter in order to filter the detected events. For example, when one wishes to date the arrival of the laser pulse, it is possible to provide for considering only the events generated in a time window limited to the laser pulse width. The MxN SPAD matrix is then considered to be the spatial resolution element of the image. There is therefore no constraint on the spatial sampling inside the image. In this case, the microlenses can have an irregular spatial distribution. In particular, the microlens matrix can include microlenses with different dimensions. This in particular makes it possible to compensate for any differences in efficiency of the microlenses as a function of their positioning in the matrix. Indeed, depending on the technology used to produce the microlenses, and in particular in the case of diffractive structures, the light collection efficiency by the microlens can decrease when the shift between the optical axis of the microlens and its center increases. To compensate for this decrease, it is possible to provide for varying the surface of the microlens as a function of the shift of its optical axis relative to its center.

Figure 5:
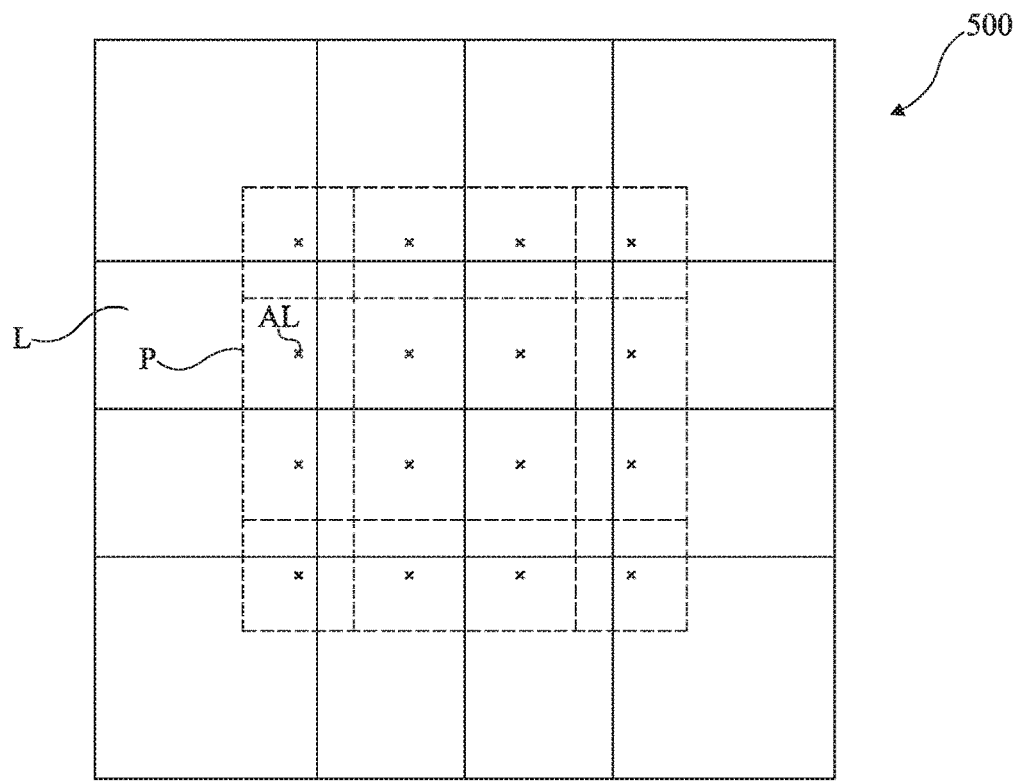
FIG. 5 shows another embodiment variant of the image sensor of FIG. 2.

FIG. 5 is a top view in the same orientation as the top view of FIG. 2A, illustrating a variant of the image sensor of FIG. 2. The sensor 500 of FIG. 5 differs from the sensor 200 of FIG. 2 primarily by the shape of its MxN microlenses L.

In the example of FIG. 5, the microlenses can have different shapes and/or dimensions as a function of their position in the microlens matrix, with the understanding that each microlens has a total surface area greater than the surface of the pixel with which it is associated. In the example of FIG. 5, the MxN microlenses all have square or rectangular shapes, but have a larger surface when the shift of their optical axis relative to the center of the lens is substantial.

Figure 6:
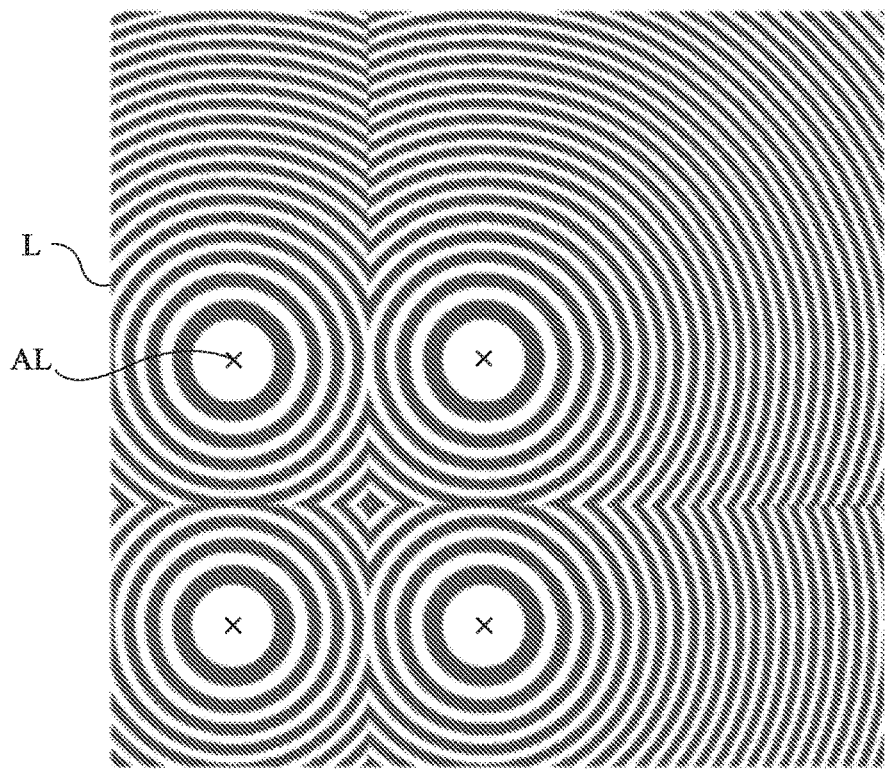
FIG. 6 shows an exemplary embodiment of a microlens of the image sensor of FIG. 5.

FIG. 6 schematically shows an example of the microlenses L of the image sensor of FIG. 5. In this example, like in the example of FIG. 3, the microlenses L are diffractive microlenses of the FZP type made up of concentric rings or ring portions formed by lithography and etching of a planar layer. In FIG. 6, for simplification purposes, only four microlenses L, respectively corresponding to the four microlenses making up the upper right quadrant of the microlens matrix in FIG. 5, have been shown.

Figure 7:
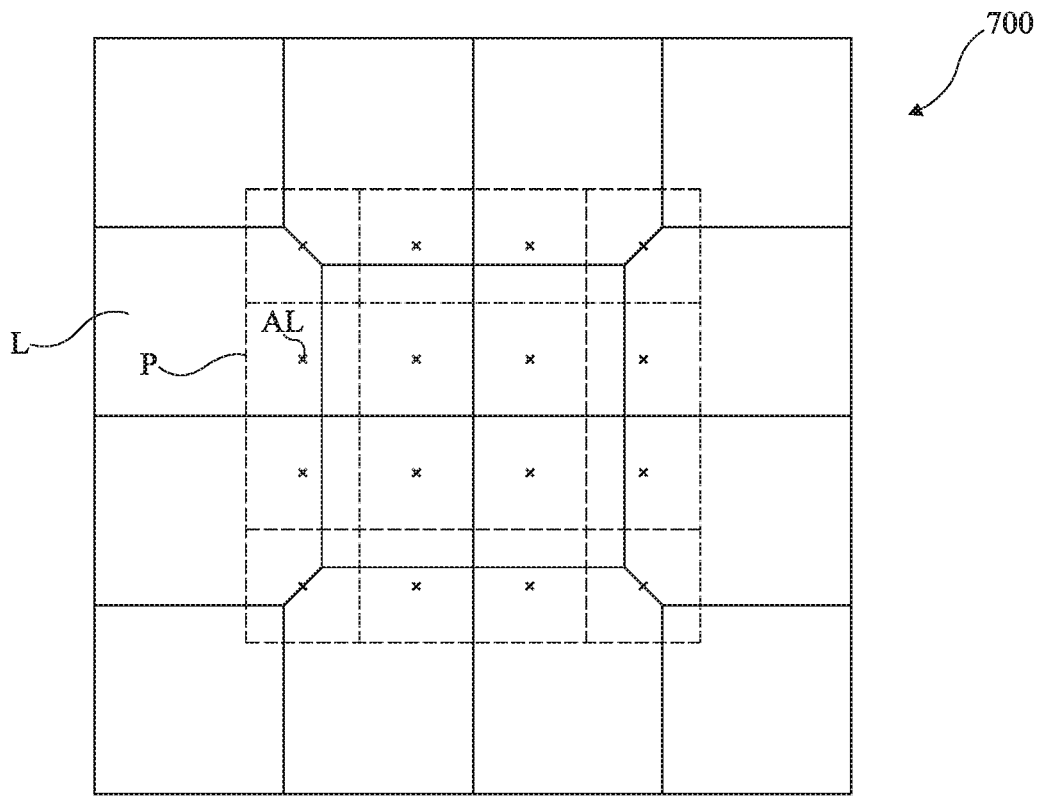
FIG. 7 shows another embodiment variant of the image sensor of FIG. 2.
Figure 8:
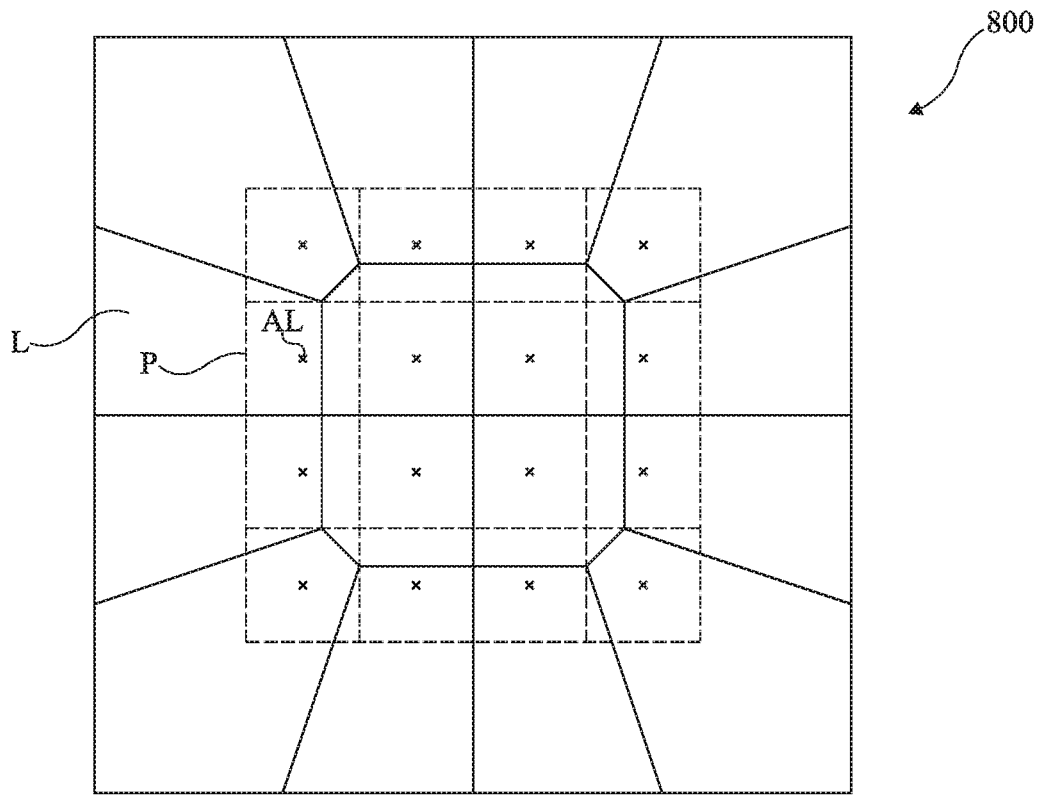
FIG. 8 shows another embodiment variant of the image sensor of FIG. 2.

FIGS. 7 and 8 are top views in the same orientation as FIG. 5, illustrating two variants of the sensor of FIG. 5. The sensors 700 and 800 of FIGS. 7 and 8 differ from the sensor 500 of FIG. 5 primarily by the shape of their M×N respective microlenses L, which are not necessarily rectangular. In the sensor 700 of FIG. 7, the microlens matrix comprises rectangular microlenses and non-rectangular microlenses. In the sensor 800 of FIG. 8, the microlens matrix comprises only non-rectangular microlenses.

Figure 9:
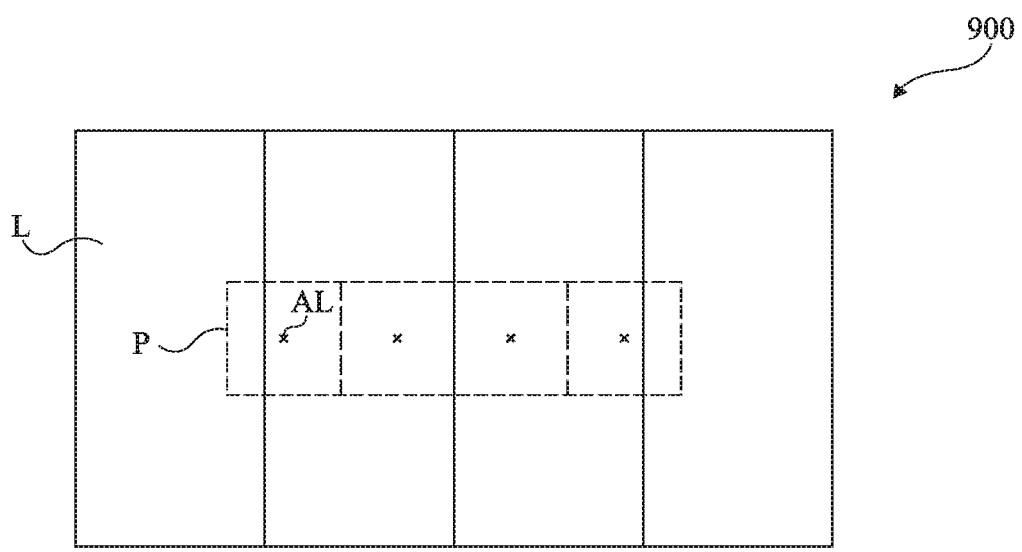
FIG. 9 shows another embodiment variant of the image sensor of FIG. 2.

FIG. 9 is a top view, in the orientation of the top view of FIG. 2A, illustrating another embodiment variant of the sensor of FIG. 2. The sensor 900 of FIG. 9 differs from the sensor of FIG. 2 primarily in that it does not involve a two-dimensional sensor (M and N greater than or equal to 2), but a linear sensor including a strip of M pixels arranged in a row (M greater than or equal to 2 and N=1).

Like in the example of FIG. 2, each microlens L has, in top view, a surface greater than the surface of the pixel P with which it is associated. More specifically, each microlens has, in the alignment direction of the pixels, a dimension greater than the dimension of the pixel P with which it is associated. Thus, the pitch of the microlens strip L is greater than the pitch of the pixel matrix P, in the alignment direction of the pixels P. This makes it possible to increase the collection surface of each pixel P, and therefore to increase the sensitivity of the sensor.

Various embodiments and variants have been described. Those skilled in the art will understand that certain features of these embodiments can be combined and other variants will readily occur to those skilled in the art. In particular, the variant of FIG. 4 can be combined with the variants of FIG. 5, 7, 8 or 9. Additionally, the variants of FIG. 5, 7 or 8 can be adapted to the variant of FIG. 9.

Finally, the practical implementation of the embodiments and variants described herein is within the capabilities of those skilled in the art based on the functional description provided hereinabove.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An image sensor, comprising:
   a semiconductor substrate;
   a plurality of pixels formed in and on the semiconductor substrate and arranged in a pixel matrix with N rows and M columns, with N being an integer greater than or equal to 1 and M being an integer greater than or equal to 2; and
   a plurality of microlenses facing the substrate, each of the plurality of microlenses associated with a respective pixel, the plurality of microlenses being arranged in a microlens matrix in N rows and M columns, wherein, in a direction of the rows of the pixel matrix, a pitch of the microlens matrix is greater than a pitch of the pixel matrix, a first one of the plurality of microlenses having a different shape than a second one of the plurality of microlenses, and the first one of the plurality of microlenses having a square shape, the second one of the plurality of microlenses being non-rectangular polygon shape, the second one of the plurality of microlenses is laterally surrounding the first one of the plurality of microlenses.

2. The image sensor according to claim 1, wherein an optical axis of each microlens passes through a center of a photosensitive area of the respective pixel.

3. The image sensor according to claim 1, wherein the pixel matrix includes a Single Photon Avalanche Diode (SPAD) matrix.

4. The image sensor according to claim 1, wherein N is greater than or equal to 2, and wherein, in a direction of the columns of the pixel matrix, the pitch of the microlens matrix is greater than the pitch of the pixel matrix.

5. The image sensor according to claim 1, wherein pixels of the plurality of pixels have a substantially same size in the direction of the rows of the pixel matrix and in a direction of the columns of the pixel matrix.

6. The image sensor according to claim 5, wherein microlenses of the plurality of microlenses all have substantially same dimensions in the direction of the rows of the pixel matrix and in the direction of the columns of the pixel matrix.

7. The image sensor according to claim 5, wherein microlenses of the plurality of microlenses have different dimensions in the direction of the rows of the pixel matrix or in the direction of the columns of the pixel matrix.

8. The image sensor according to claim 7, wherein a surface area of each microlens of the plurality of microlenses corresponds to a distance between a central axis of the microlens and a central axis of the respective pixel.

9. The image sensor according to claim 1, further comprising an optical spacer arranged between the pixel matrix and the microlens matrix.

10. The image sensor according to claim 9, wherein the optical spacer includes a transparent planar layer.

11. The image sensor according to claim 1, wherein the plurality of microlenses are at least one of refractive microlenses or diffractive microlenses.

12. The image sensor according to claim 11, wherein the plurality of microlenses are diffractive microlenses of a Fresnel Zone Plate (FZP) type.

13. The image sensor according to claim 11, wherein the plurality of microlenses are diffractive microlenses of a meta-surface type.

14. An image sensor, comprising:
a substrate including a plurality of pixels arranged in a pixel matrix; and
a plurality of microlenses arranged in a microlens matrix on the substrate and overlying the plurality of pixels, each of the plurality of microlenses being associated with a respective pixel and having a larger size than the respective pixel, the microlens matrix extending outwardly beyond a periphery of the pixel matrix, and a first one of the plurality of the microlenses being square and a second one of the plurality of microlenses being non-rectangular polygon shape. the second one of the plurality of microlenses is laterally surrounding the first one of the plurality of microlenses.

15. The image sensor according to claim 14, wherein a center of each microlens of the plurality of the microlenses is offset with respect to a center of the respective pixel.

16. The image sensor according to claim 14, wherein a pitch of the microlens matrix is greater than a pitch of the pixel matrix along a row direction and a column direction.

17. The image sensor according to claim 14, further comprising a transparent planar layer between the pixel matrix and the microlens matrix, the transparent planar layer having a thickness within a range from 5 µm to 50 µm.

18. A method, comprising:
forming a plurality of microlenses over and facing a plurality of pixels in semiconductor substrate, the plurality of pixels arranged in a pixel matrix with N rows and M columns, with N being an integer greater than or equal to 1 and M an integer greater than or equal to 2, and the pixel matrix including at least one Single Photon Avalanche Diode, the forming the plurality of microlenses including:
forming each microlens of the plurality of microlenses associated with a respective pixel, the plurality of microlenses being arranged in a microlens matrix in N rows and M columns, a pitch of the microlens matrix being greater than a pitch of the pixel matrix in a direction of the rows of the pixel matrix; and
forming a first one of the plurality of the microlenses as a square and a second one of the plurality of microlenses as a non-rectangular polygon shape, the second one of the plurality of microlenses is laterally surrounding the first one of the plurality of microlenses.

19. The method of claim 18, further comprising:
forming an optical spacer between the pixel matrix and the microlens matrix.

* * * * *